United States Patent [19]
Tsukada et al.

[11] Patent Number: 5,575,872
[45] Date of Patent: Nov. 19, 1996

[54] METHOD FOR FORMING A CERAMIC CIRCUIT SUBSTRATE

[75] Inventors: Mineharu Tsukada; Masaharu Hida; Koji Omote, all of Kawasaki, Japan

[73] Assignee: Fujitsu Limited, Kanagawa, Japan

[21] Appl. No.: 258,223

[22] Filed: Jun. 10, 1994

[30] Foreign Application Priority Data

Sep. 20, 1993 [JP] Japan .................................. 5-233738
Mar. 16, 1994 [JP] Japan .................................. 6-045921

[51] Int. Cl.⁶ .......................... B32B 31/06; B32B 31/20; B32B 31/10
[52] U.S. Cl. ............................ 156/89; 156/182; 156/263; 264/61; 264/63
[58] Field of Search .................. 264/58, 59, 63, 264/67, 43, 44; 156/89, 182; 361/688, 692, 719, 720; 174/250, 255, 256, 258

[56] References Cited

U.S. PATENT DOCUMENTS

| | | |
|---|---|---|
| 3,345,160 | 10/1967 | Miccioli . |
| 3,852,877 | 12/1974 | Ahn et al. ................... 156/89 X |
| 4,766,671 | 8/1988 | Utsumi et al. .............. 156/89 X |
| 4,770,953 | 9/1988 | Horiguchi et al. . |
| 4,806,295 | 2/1989 | Trickett et al. ................. 264/59 |
| 4,814,030 | 3/1989 | Dubuisson et al. ............ 156/89 |
| 4,956,037 | 9/1990 | Vivaldi .................... 156/89 X |
| 5,015,314 | 5/1991 | Suzuki et al. . |
| 5,063,121 | 11/1991 | Sato et al. ................. 156/89 X |
| 5,139,716 | 8/1992 | Wrona et al. ................. 264/59 |
| 5,165,986 | 11/1992 | Gardner et al. . |
| 5,173,229 | 12/1992 | Miyamoto .................... 264/59 |

FOREIGN PATENT DOCUMENTS

| | | |
|---|---|---|
| 57-7041 | 2/1982 | Japan . |
| 60-147143 | 8/1985 | Japan . |
| 61-290004 | 12/1986 | Japan .................... 264/59 |
| 2-121355 | 5/1990 | Japan . |
| 3-265194 | 11/1991 | Japan . |

*Primary Examiner*—James Engel
*Assistant Examiner*—M. Curtis Mayes
*Attorney, Agent, or Firm*—Nikaido, Marmelstein, Murray & Oram LLP

[57] ABSTRACT

A laminated body of a plurality of slit ceramic green sheets 10 with rod-shaped members 11 placed in the spaces defined by the slits 9 is sandwiched by two laminated ceramic green bodies of a plurality of blank ceramic green sheets 8, pressing to make the laminated ceramic green bodies integral with each other, and then after the rod-shaped members 11 are pulled out, the integrated laminated ceramic green bodies are sintered. Thus circular sectional channels 13 with reduced flow resistance for a coolant flowing therethrough are formed inside the ceramic circuit substrate 14. The channels 13 can have low flow resistance and can have high cooling efficiency.

15 Claims, 9 Drawing Sheets

0
METHOD FOR FORMING A CERAMIC CIRCUIT SUBSTRATE

BACKGROUND OF THE INVENTION

The present invention relates to a ceramic substrate, particularly to an ceramic circuit substrate for use in electronic circuits, etc., and a method for forming the same.

With recent higher integration density and higher speed of LSI chips, etc., the LSI chips, etc. give forth or discharge more heat, and it is increasingly required to positively cool the electronic parts. In the conventional LSI chips or packages, etc., heat radiation fins are provided in the devices and their substrates for cooling, the substrates themselves are formed of highly heat conducting materials, and channels for coolants are provided in the circuit substrates, whereby their substrate temperatures are lowered as much as possible.

For example, Japanese Patent Laid-Open Publication No. 52-12524/1977 discloses a liquid cooling electronic device in which a region on a circuit substrate for a device is defined by a spacer, and the region defined by the spacer is filled with a coolant, whereby the device is cooled.

Japanese Patent Laid-Open Publication No. 62-252198/1988 and Japanese Patent Laid-Open Publication No. 60-126854/1985 disclose cooling apparatus in which cooling fluid is injected from nozzles to electronic parts on circuit substrates to supply the cooling fluid directly to the individual electronic parts, whereby the electronic parts are cooled.

Japanese Patent Laid-Open Publication No. 61-92721/1986 discloses a method for making a large cooling panel by burying a core in a groove formed in a substrate, welding a top plate, and removing the core.

Japanese Patent Laid-Open Publication No. 61-154098/1986, Japanese Patent Laid-Open Publication No. 03-225889/1991 and Japanese Patent Laid-Open Publication No. 03-242996/1991 disclose circuit substrates in which coolant channels are provided in the circuit substrates to prevent temperature rises in electronic circuits.

Japanese Patent Laid-Open Publication No. 03-263398/1991 discloses a cooling structure for cooling a circuit substrate, which comprises a cooling plate provided in a heating module opposed to the circuit substrate.

In connection with forming the channel inside a circuit substrate the following art are proposed. That is, in preparing the substrate by green sheet lamination, a pattern of an organic substance is formed on the surfaces of green sheets by screen printing, and a number of the green sheets are laminated, and then sintered to decompose and scatter or liberate the organic substance to form the channel, or grooves are formed in green sheets in the middle parts, and the green sheets are laminated and sintered to form a channel.

But the above-described conventional art need large-sized cooling means on the circuit substrates, cooling pipes for coolants to flow, and cooling plates, which make the circuit substrate large, and make the structures complicated.

The proposed green sheet lamination method for forming the channel in a circuit substrate has problems that time is taken to decompose and scatter the organic substance to form the channel, and the resultant channel has a complicated configuration which results in high flow resistance. The formation of the channel by laminating grooved green sheets has a problem that the grooves might be broken under pressure when the green sheets are laminated, with the result of higher flow resistance. Higher flow resistance makes flow of the coolant difficult with the result of lower cooling effect.

SUMMARY OF THE INVENTION

An object of the present invention is to provide a ceramic circuit substrate whose coolant channel has low flow resistance and can be easily fabricated, and a method for forming the same.

The object of the present invention is achieved by a ceramic circuit substrate comprising a body formed by sintering a laminated ceramic green body of a plurality of ceramic green sheets, and a coolant channel formed in the body for flowing a coolant.

The object of the present invention is achieved by a method for forming a ceramic circuit substrate comprising the steps of: preparing a plurality of blank ceramic green sheets; forming at least two laminated ceramic green bodies by laminating the plurality of blank ceramic green sheets; placing a plurality of rod-shaped members in parallel with each other on the first laminated ceramic green body; sandwiching the rod-shaped members by laminating the second laminated ceramic green body; pressing the thus laminated ceramic green bodies and the rod-shaped members sandwiched by the first and second laminated ceramic green bodies, and conducting a plastic deformation to the laminated ceramic green bodies to make integral, thereby forming a composite structure composed of a compressed ceramic green body obtained by the compression and deformation of the laminated ceramic green bodies and the rod-shaped members arranged in parallel with each other embedded therein; pulling out the rod-shaped members from the composite structure, thereby forming a compressed ceramic green body having a plurality of cylindrical spaces, arranged in parallel with each other formed by the removal of the rod-shaped members; prefiring the compressed ceramic green body to debind an organic binder component in the compressed ceramic green body, thereby forming a presintered ceramic body; and sintering the presintered ceramic body for producing a sintered body having a plurality of coolant channels formed therein for flowing a coolant.

The object of the present invention is achieved by a method for forming a ceramic circuit substrate comprising the steps of: preparing a plurality of blank ceramic green sheets; preparing a plurality of slit ceramic green sheets with a plurality of slits arranged in parallel with each other formed therein, obtained by slit-punching of the blank ceramic green sheet; forming at least two blank laminated ceramic green bodies by laminating the plurality of blank ceramic green sheets; forming a laminated slit ceramic green body by laminating the plurality of slit ceramic green sheets, thereby forming spaces defined by the slits of the slit ceramic green sheets in the laminated slit ceramic body; sandwiching the laminated slit ceramic green body with rod-shaped members each placed in each of the spaces, by he two blank laminated ceramic green bodies, thereby forming a laminated composite green body with each of the rod-shaped members disposed in each of the spaces; pressing and conducting a plastic deformation to the laminated composite green body to make integral, thereby forming a composite structure composed of a compressed ceramic green body, obtained by a deformation and compression of the slit and blank ceramic green sheets, and the rod-shred members arranged in parallel with each other embedded therein; pulling out the rod-shaped members from the composite structure, thereby forming a compressed ceramic green body having a plurality of cylindrical spaces arranged in parallel with each other formed by the removal of the rod-shaped members; prefiring the compressed ceramic green body to debind an organic binder component in the compressed ceramic green body, thereby forming a presintered ceramic body; and sintering the presintered ceramic body for producing a sintered body having a plurality of coolant channels formed therein for flowing a coolant.

The ceramic circuit substrate according to the present invention formed by sintering a plurality of ceramic green sheets includes coolant channels of substantially circular section for a coolant to flow through. The channels can have low flow resistance and can have high cooling efficiency.

According to the method for forming the ceramic circuit substrate, rod-shaped members are sandwiched by two laminated ceramic green bodies of a plurality of blank ceramic green sheets, pressed and conducted plastic deformation to the laminated ceramic green bodies to make the two laminated bodies integral with each other, thereby forming a composite structure composed of a compressed laminated ceramic green body consisting of deformed and compressed the ceramic green sheets and the rod-shaped members arranged in parallel with each other embedded or buried therein, and after the rod-shaped members are pulled out from the composite structure thereby forming a compressed laminated ceramic green body having cylindrical spaces formed by the removal or pulled out of the rod-shaped members for forming coolant channels, the integral laminated bodies or the compressed laminated ceramic green body is subjected to prefiring and final firing and sintered. The ceramic circuit substrate having coolant channels of low flow resistance can be easily formed.

Blank ceramic green sheets, and slit ceramic green sheets formed of the blank ceramic green sheets having a plurality of slits formed in by slit punching of the blank ceramic green sheet using slit punching machine are prepared. A laminated ceramic green body of a plurality of slit ceramic green sheets with rod-shaped members placed in the spaces defined by the slits is sandwiched by two laminated ceramic green bodies of a plurality of the blank ceramic green sheets, and pressed to make the laminated bodies integral with each other. After the rod-shaped members are pulled out, the integrated laminated ceramic green bodies are conducted to debinding process and firing process thereby sintered. Thus the ceramic circuit substrate having the cooling channels of low flow resistance can be easily formed.

Blank ceramic green sheets, some kinds of slit ceramic green sheets formed of the blank sheets with some kinds of slits formed in are prepared. Respective laminated ceramic green bodies of a plurality of the slit ceramic green sheets of some kinds with rod-shaped members placed in the spaces defined by the slits are sandwiched by two laminated ceramic green bodies of a plurality of the blank ceramic green sheets, pressed to make the laminated bodies integral with each other, i.e., a composite structure composed of a compressed laminated ceramic green body consisting of deformed and compressed the ceramic green sheets and the rod-shaped members arranged in parallel to each other embedded therein. After the rod-shaped members are pulled out, the integrated laminate bodies are sintered. Thus the ceramic circuit substrate with very high cooling efficiency and high reliability can be easily formed.

BRIEF DESCRIPTION OF THE DRAWINGS

FIGS. 2f–2l are views (part 2) schematically showing the method for forming the ceramic circuit substrate according to the first embodiment of the present invention.

DETAILED DESCRIPTION OF THE INVENTION

The ceramic circuit substrate and the method for forming the same according to a first embodiment of the present invention will be explained with reference to FIGS. 1 to 5. FIGS. 1a–1e and 2f–2i are views schematically showing the steps of the method for forming the ceramic circuit substrate according to the first embodiment. FIGS. 3A to 3E and 4A and 4B are views of the ceramic circuit substrate in the respective steps of the method for forming the ceramic circuit substrate according to the first embodiment.

As raw materials for green sheets, aluminium nitride (AlN) powder 1, yttria ($Y_2O_5$) powder 2, polyvinylbutylar as an organic binder 3, and dibutylphtalate as a plasticizer are prepared (the step (a) in FIG. 1). 100 weight parts of inorganate ingredients of 95 wt.% aluminium nitride (AlN) powder 1 and 5 wt.% of yttria ($Y_2O_5$) powder 2, 6 weight parts of the organic binder, and 6 weight parts of the plasticizer are kneaded by the use of 100 weight parts of an organic solvent (the step (b) in FIG. 1).

Then a slurry material 4 into which they are thus kneaded is loaded in a green sheets forming apparatus (doctor blade apparatus) 5, is casted or stretched thin over a carrier film 6, and a strip of green sheet 7 is prepared (the step (c) in FIG. 1).

Figure 1A:
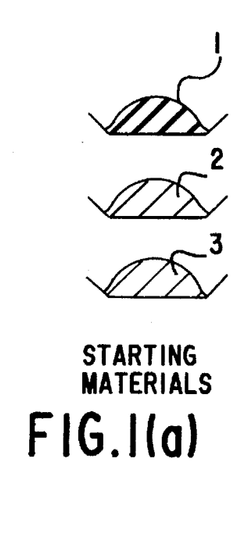
FIGS. 1a–1e are views (part 1) schematically showing the method for forming the ceramic circuit substrate according to a first embodiment of the present invention.
Figure 1B:
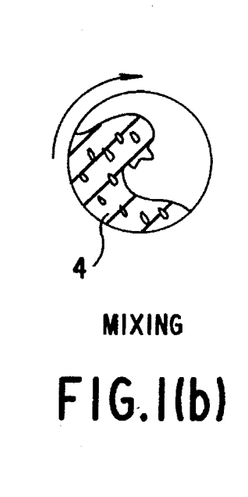
Figure 1C:
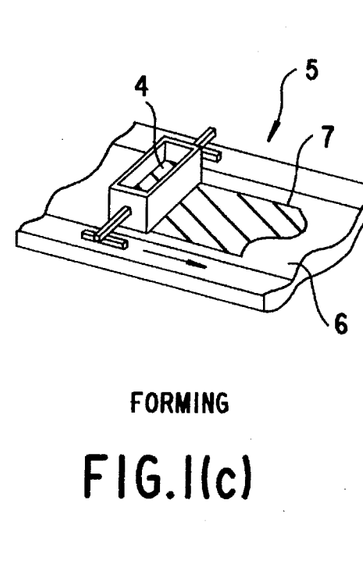
Figures 1D, 1E:
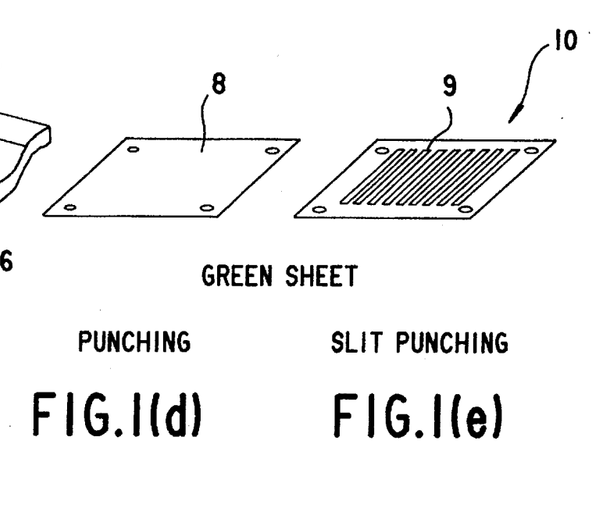

Then the green sheet 7 is punched into a 100 mm square sheet by a press (not shown), and holes are formed in the four corners by a punching machine. And a blank green sheet 8 by punching or blanking is prepared (the step (d) in FIG. 1).

Then in the first embodiment, the blank green sheet 8 is formed into a slit green sheet 10 of a plurality of 2.5 mm-width and 80 mm-length slits 9 laid in parallel with each other (the step (e) in FIG. 1). In the first embodiment, the blank green sheet 8 is called blank sheet 8, and the slit green sheet 10 is called slit sheet so as to discriminate the former from the latter.

Many numbers of the blank sheets 8 and the slit sheets 10 are thus prepared.

Figures 2F, 2G:
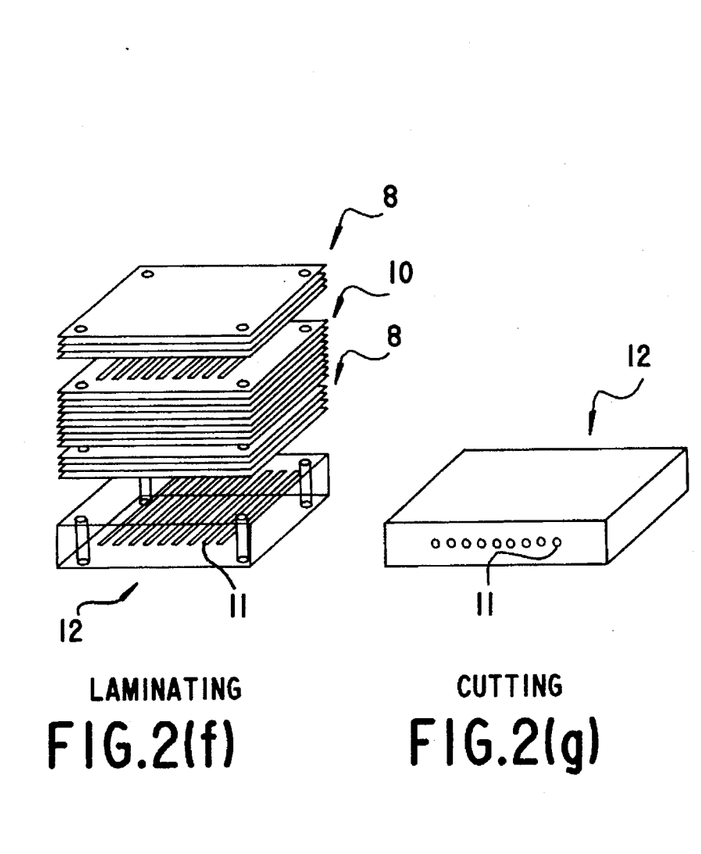
Figure 3A:
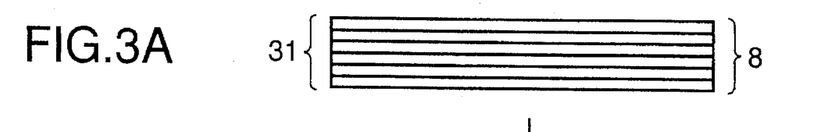
FIGS. 3A to 3E are views of the laminating steps in FIG. 2.
Figure 3B:
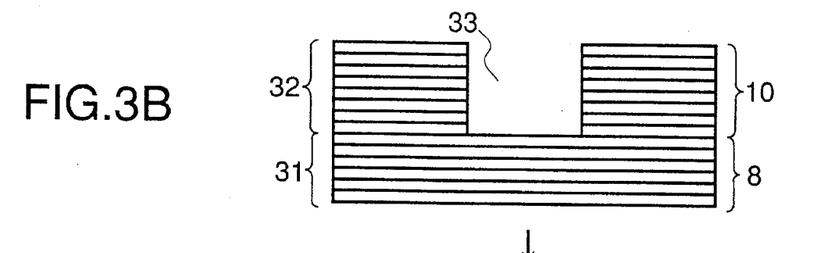
Figure 3C:
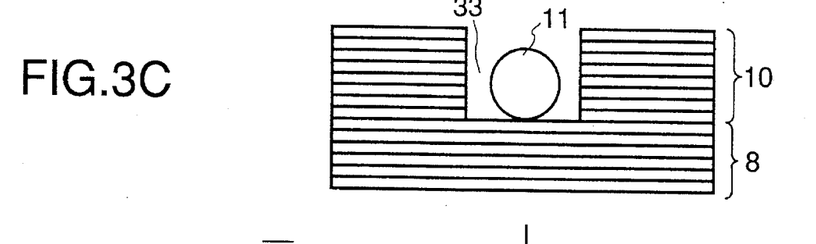
Figure 3D:
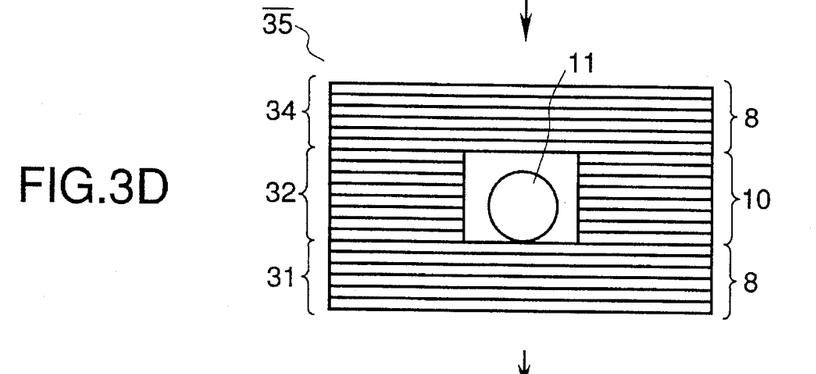
Figure 3E:
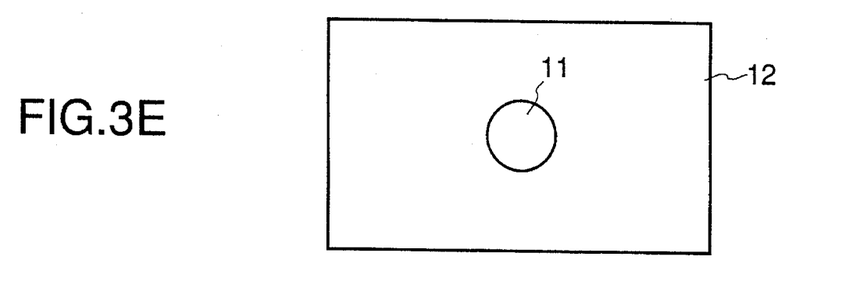

Plural numbers of the blank sheets 8 and the slit sheets 10 are laid one on another, and a laminated body having a 2 mm-diameter rod (rod-shaped member) 11 disposed corresponding slits inside therein is formed (the step (f) in FIG. 2). That is, for example, six sheets of the blank sheets 8 without slits are laid one on another into a lower laminated body 31 (FIG. 3A), and on this laminated body 31, for example, eight sheets of the slit sheets 10 are laid with the slits 9 aligned with each other into an intermediate laminated body 32 (FIG. 3B). One rod (rod-shaped member) 11 of Teflon (trademark), or polytetrafluoroethylene is placed in each groove 33 formed by the slits 9 (FIG. 3C), and further, for example, six sheets of the blank sheets 8 are laid one on another and an upper laminated body 34 is laminated or set on the intermediate laminated body 31 (FIG. 3D). The thus-prepared a laminated body 35 is hot pressed at 80° C. and 30 MPa by a press to integrate the thus-laminated green sheets 8, 10, 8 to form a compressed laminated body 12 having a plurality of rods 11 embedded or buried therein (FIG. 3E).

Figure 4A:
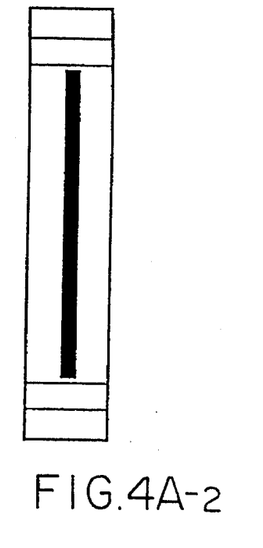
FIGS. 4A and 4B are views of the cutting step and the step of pulling out the rods in FIG. 2.
Figure 4A:
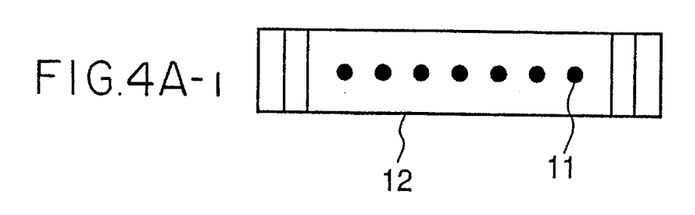

Thus one laminated body 12 containing a plurality of rods 11 inside as shown in FIG. 4A can be prepared.

Then both margins of the laminated body 12 which are located in the longitudinal direction of the rods 11 are cut off in an about 10 mm width, so that both ends of the rods 11 are exposed on the side surfaces of the laminated body 12 (the step (g) in FIG. 2).

Figure 2H:
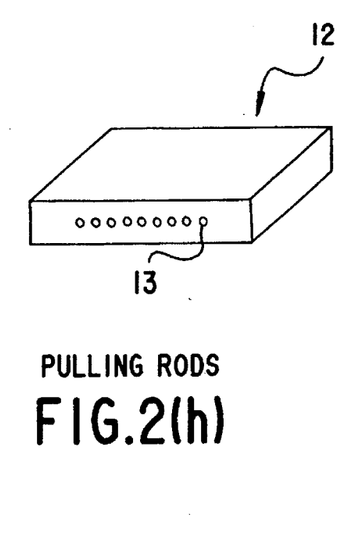

Next, the exposed ends of the rods 11 on one side surface are gripped by a clamp, and the rods 11 are pulled out from the laminated body 12 (the step (h) in FIG. 2).

Figure 4B:
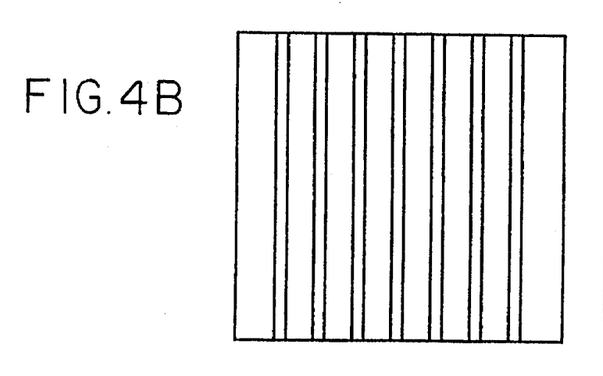
Figure 4B:
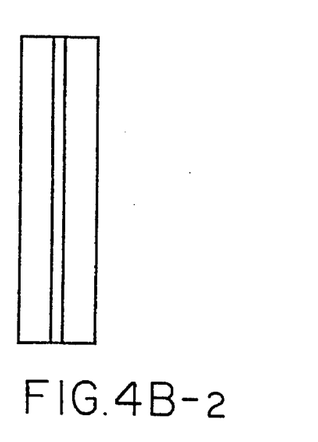
Figure 4B:
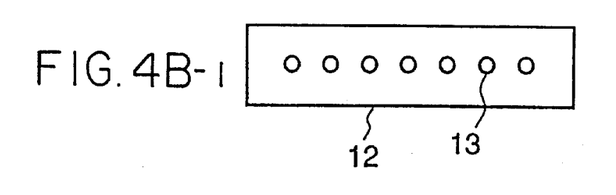

Thus as shown in FIG. 4B, channels 13 of a configuration substantially corresponding to a sectional shape of the rods 11 are formed throughout from one side surface to the other side surface, i.e., a presintered compressed laminated ceramic green body having cylindrical spaces formed by the removal of the rod-shaped members for producing coolant channels arranged in parallel with each other is obtained.

In forming the channels, it is preferable that the interiors of the channels 13 is blown with, e.g., nitrogen gas to remove residual green sheets therein.

Figure 2I:
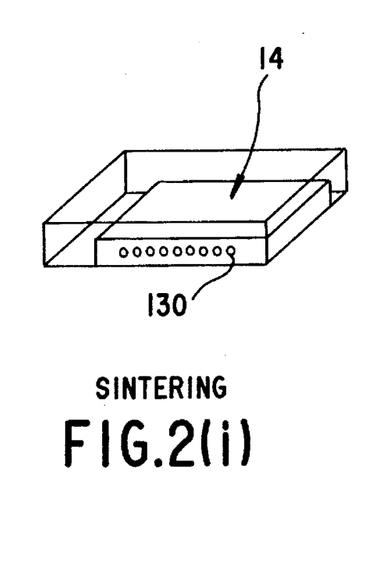
Figure 5:
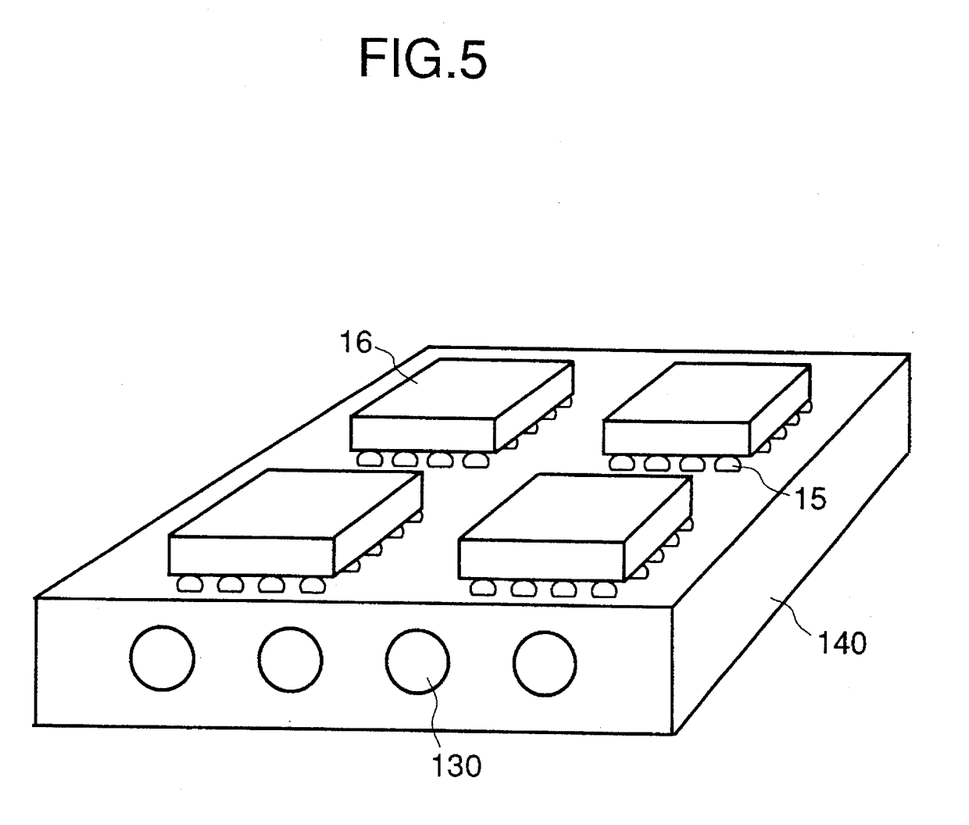
FIG. 5 is a perspective view of the ceramic circuit substrate according to the first embodiment of the present invention.

Next, the laminated body 12 having the channels 13 formed is heated from room temperature at a rate of 50° C./hr and allowed to stand 700° C. for 5 hours in nitrogen gas flows of to be defatted followed by allowing to cool room temperature and the defatted or debinded body is heated from room temperature to 1800° C. at a rate of 600° C./hr, and then sintered in nitrogen gas flows of 1800° C. for 5 hours. In the sintering the laminated body 12 is gradually sintered and shrunk as shown in the step (i) in FIG. 2 finally down to a sintered ceramic substrate 14 of the size of the solid line. The thus-prepared sintered ceramic substrate 14 is cut, and a required circuit pattern is formed on the cut sintered ceramic substrate 14 to complete an ceramic circuit substrate 140 as shown in FIG. 5. And an intended circuit substrate is completed.

Thus according to the first embodiment, green sheets are laminated by the conventional green sheet laminating method so that the rods 11 are held at the middle part of the laminated body 35, whereby the grooves 33 in the form of the slits are deformed by the plastic deformation of the laminated ceramic green body 35 into the coolant channels 13 of circular section. According to the first embodiment, the rods are formed of Teflon, which has less wetting property with respect to other materials, so that the rods 11 can be easily pulled out of the laminated body 12 after the hot pressing process.

FIG. 5 shows an example of applications of the thus-prepared circuit substrate.

In a ceramic circuit substrate 14 there are provided channels (microchannels) 130 for a coolant (not shown) to flow. A plurality of LSI chips 16 are mounted on the ceramic circuit substrate 14 through solder bumps 15 where circuit patterns are provided by screen printing method of the electro conductive paste or vacuum deposition method. A coolant is caused to flow through the channels 130 to suppress temperature rises of the ceramic circuit substrate 140 by heating of the LSI chips 16.

The method for forming the circuit substrate according to a second embodiment of the present invention will be explained with reference to FIGS. 6A to 6C and 7A to 7C. Common members of the first embodiment of FIGS. 1 to 5 are represented by common reference numerals not to repeat their explanation.

Figure 6A:
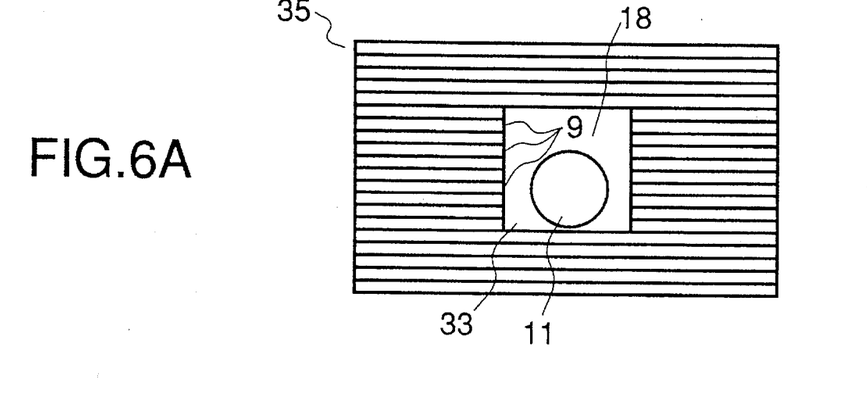
FIGS. 6A to 6C are views explaining cracks generated in the ceramic circuit substrate according to the first embodiment of the present invention.
Figure 6B:
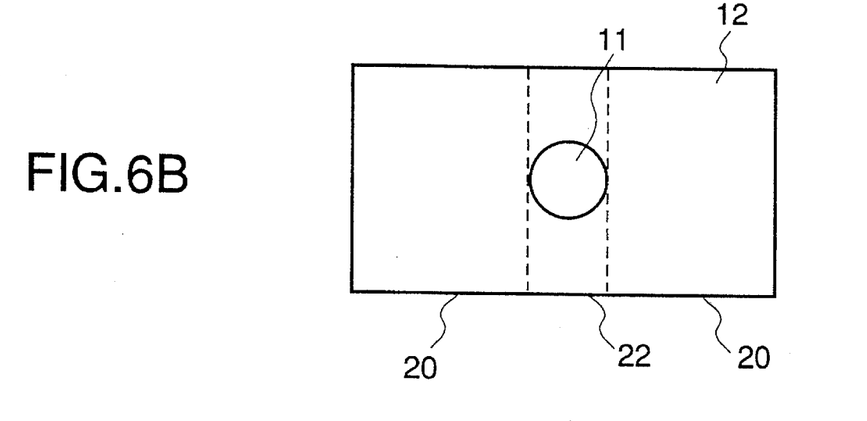
Figure 6C:
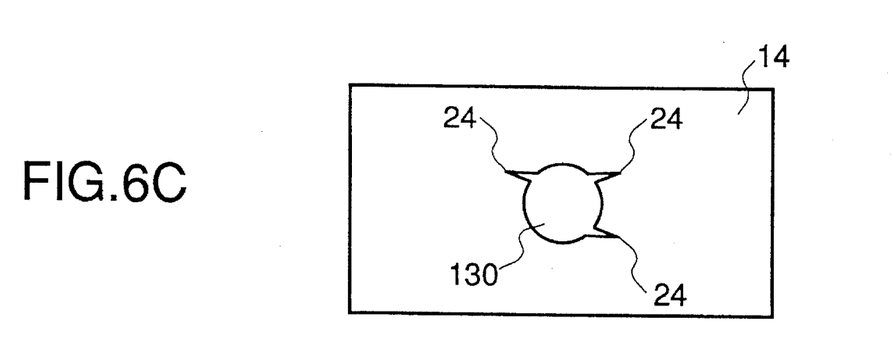
Figure 7A:
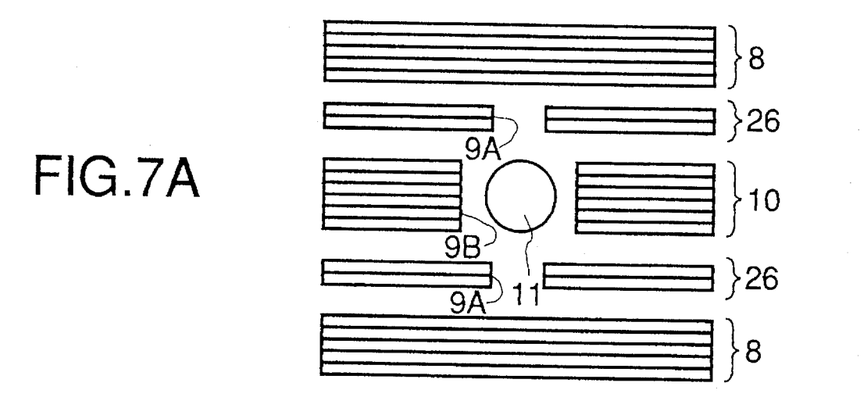
FIGS. 7A to 7C are views of the laminating steps of the method for forming the ceramic circuit substrate according to a second embodiment of the present invention.
Figure 7B:
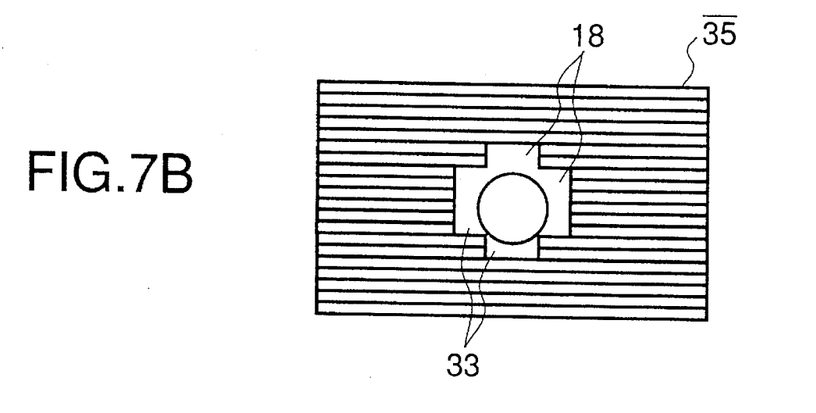
Figure 7C:
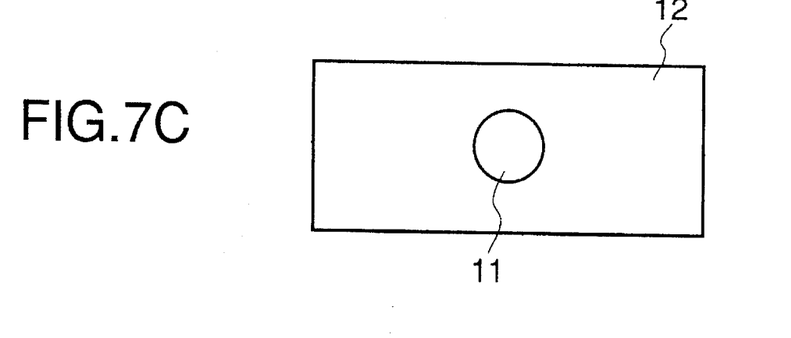

FIGS. 6A to 6C are views explaining generation of cracks by the first embodiment. FIGS. 7A to 7C are views explaining the method for forming the circuit substrate according to the second embodiment.

In the first embodiment, rods 11 of Teflon are placed in the grooves defined by the slits 9 in the laminated slit sheets 10, and then the laminated slit sheets 10 are sandwiched by laminated bodies of the blank sheets 8, and sintered after the rods 11 of Teflon are pulled out. And the circuit substrate is formed. But in forming the round channels by the first embodiment, gaps 18 are defined around the Teflon rods 11 before the pressing (FIG. 6A). There is a risk that a pressure is not uniformly applied because of the gaps 18, and a higher density part 20 and a lower density part 22 might be generated after the pressing as shown in FIG. 6B. Consequently unless heating temperatures can be subtly controlled in the sintering, there is a risk that cracks 24 might be generated due to the disuniform densities (FIG. 6C). Then the second embodiment provides the method for forming the circuit substrate which can form round channels while successfully suppressing generation of the cracks 24.

In the second embodiment shown in FIGS. 7A to 7C, in addition to a first slit sheet 10 with 2.5 mm-width and 80 mm-length slits 9 which is the same as the slit sheet 10 in the first embodiment, a second slit sheet 26 with slits of a width different from that of the slits 9 are used. The second slit sheet has a plurality of 1.25 mm-width and 80 mm-length slits juxtaposed with each other.

Plural numbers of blank sheets 8 and the two kinds of slit sheets 10, 26, 10 are laminated, and a laminated body containing 2 mm-diameter rods (rod-shaped members) 11 inside is prepared. That is, for example, five sheets of the blank sheets 8 without slits are laminated one on another into a laminated body. On the laminated body, for example, two sheets of the second slit sheets 26 with the smaller-width slits 9A are laminated, and further thereon, for example, ten sheets of the first sheets 10 with the wider slits 9B are laminated. A plurality of the 2 mm-diameter rods (rod-shaped members) 11 of Teflon are placed in the grooves 33 defined by the slits 9A, 9B. Further thereon, for example, two sheets of the second slit sheets 26 with smaller-width slits 9A again laminated, and, for example, five sheets of the blank sheets 8 are laminated thereon (FIGS. 7A and 7B). Thus-prepared laminated body 35 is hot pressed by a press at 80° C. and 30 MPa to make the green sheets integral with each other, thereby formed a composite structure composed of a compressed laminated ceramic green body 12 and rod-shaped members 11 embedded therein (FIG. 7C).

The thus-prepared laminated body 35 includes two kinds of slits 9A, 9B with different widths, whereby the gaps 18 defined by the slits 9A, 9B, 9A can be approximated to a configuration of the rods 11. Density disuniformity due to the existence of the gaps 18 in the hot pressing process can be made accordingly little, with the result that cracks 24 do not take place readily by the heat treatment in defatting process (presintering to decompose or burn out the binder is the laminated ceramic green body 12) and then sintering process.

Thus, according to the second embodiment, two kinds of slit sheets 10, 26 are used to thereby density disuniformity after the pressing is reduced, so that a circuit substrate which is free from cracks can be easily formed.

The method for forming the circuit substrate according to a third embodiment of the present invention will be explained with reference to FIGS. 8A to 8C. Common reference numerals with the embodiments of FIGS. 1A to 5 are represented by common reference numerals not to repeat their explanation.

Figure 8A:
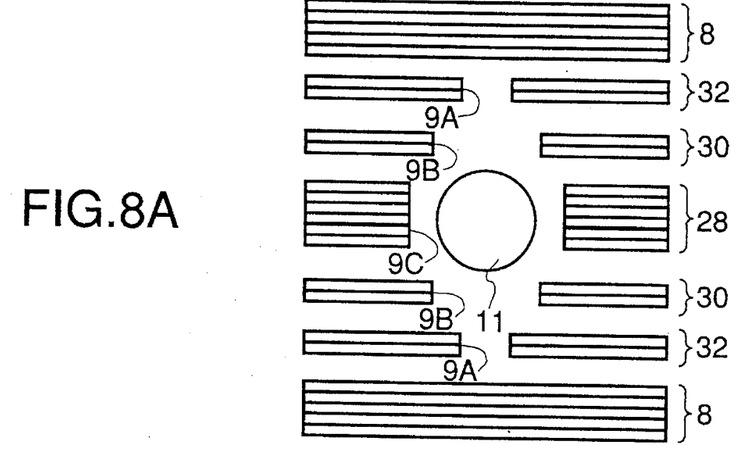
FIGS. 8A to 8C are views of the laminating steps of the method for forming the ceramic circuit substrate according to a third embodiment of the present invention.
Figure 8B:
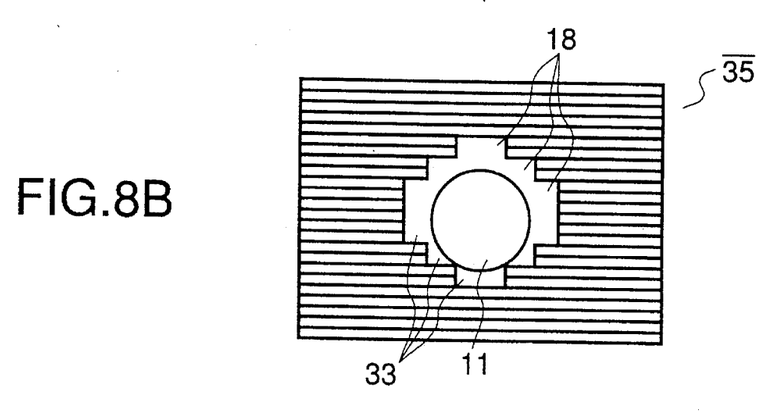
Figure 8C:
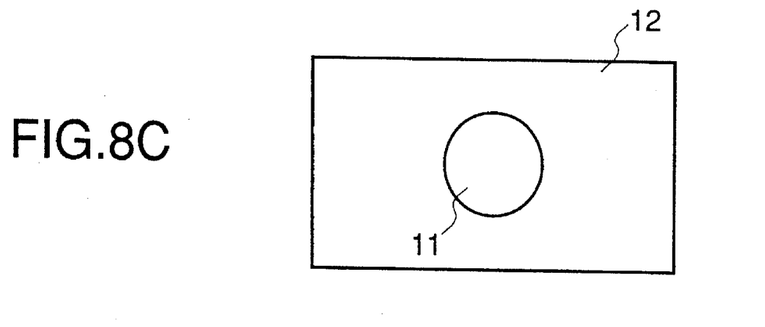

FIGS. 8A to 8C are views explaining the method for forming the circuit substrate according to the third embodiment.

In the first and the second embodiments, the channels are formed by the use of 2 mm-diameter Teflon rods, but to improve the cooling effect it is preferred that the channels are wider. But when the Teflon rods alone are simply thickened, there is a risk that large density disuniformity may occur in the pressing, and the above-described cracks 24 will occur. In the third embodiment, the second embodiment is further improved, and three kinds of slit sheets 9A, 9B, 9C are used.

First slit sheets 28 with 8.5 mm-width slits 9C, and second slit sheets 30 with 2.5 mm-width slits 9B, and third slit sheets with 1.25 mm-width slits 9A are used. All the slits 9A, 9B, 9C are formed to have 80 mm-length. The method according to the third embodiment is the same as that according to the second embodiment.

A plural number of blank sheets 8, and plural numbers of three kinds of slit sheets 32, 30, 28, 30, 32 are laminated, and a laminated body with 3 mm-diameter rods (rod-shaped members) 11 placed inside is prepared. That is, for example, five sheets of the blank sheets 8 are laminated into a lower laminated body, and, for example, two sheets of the third slit sheets 32 with smaller-width slits 9A are laminated thereon. Further, for example, two sheets of the second slit sheets 30 with medium-width slits 9B are laminated thereon. For example, seven sheets of the first slit sheets 28 with larger width slits 9C are laminated thereon. Then a plurality of 3 mm-diameter rods (rod-shaped members) 11 of Teflon are placed in the grooves defined by the slits 9A, 9B, 9C. For example, two sheets of the second slit sheets 30 with medium-width slits 9B are again laminated thereon. Further, for example, two sheets of the third slit sheets 32 with the smaller width slits 9A are again laminated thereon. For example, five sheets of the blank sheets 8 are laminated thereon (FIGS. 8A and 8B). The thus-prepared laminated ceramic green body 35 is hot pressed at 80° C. and 30 MPa to make the green sheets integrate with each other. Thereby a composite structure composed of compressed laminated ceramic green body consisting of deformed and compressed the ceramic green sheets and the rod-shaped members arranged in parallel with each other embedded therein is obtained (FIG. 8C).

The circuit substrate into which thus-prepared laminated body 12 is defatted and sintered was free from cracks.

Thus according to the third embodiment, the three kinds of slit sheets 32, 30, 28, 30, 32 are lid one on another into the laminated body, so that gaps 18 defined by the slits 9A, 9B, 9C can have a configuration approximate to the rods 11 of the large diameter. Accordingly the rod 11 can have large diameters, so that the circuit substrate has very wide channels efficiently for the cooling and can be formed without generation of cracks 24.

The method for forming the circuit substrate according to a fourth embodiment of the present invention will be explained with reference to FIGS. 9A to 9D. Common reference numerals with the fourth embodiment of FIGS. 1A to 5 are represented by common reference numerals not to repeat their explanation.

In the first to the third embodiments, the Teflon rods 11 are placed in the grooves 33 defined by the slits 9 in the slit sheets 10, but in the fourth embodiment a laminated body of blank sheets 8 alone with rods 11 placed inside is prepared.

Figure 9A:
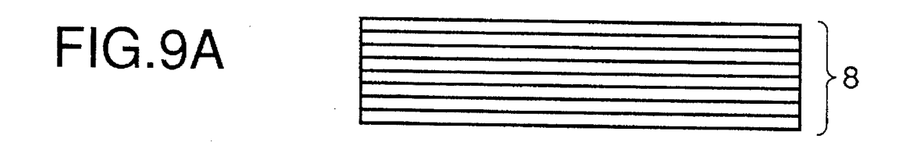
FIGS. 9A to 9D are views of the laminating steps of the method for forming the ceramic circuit substrate according to a fourth embodiment of the present invention.
Figure 9B:
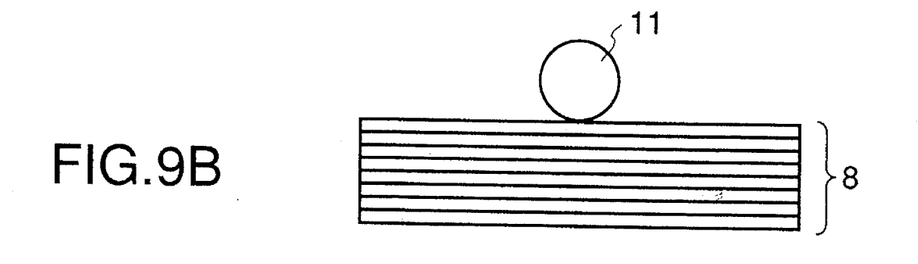
Figure 9C:
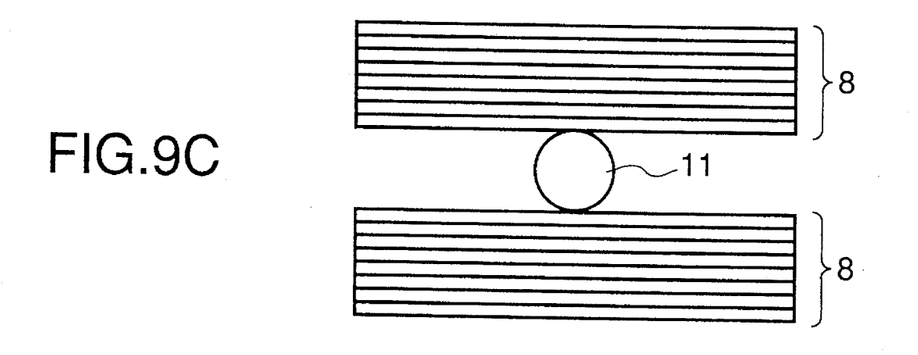
Figure 9D:
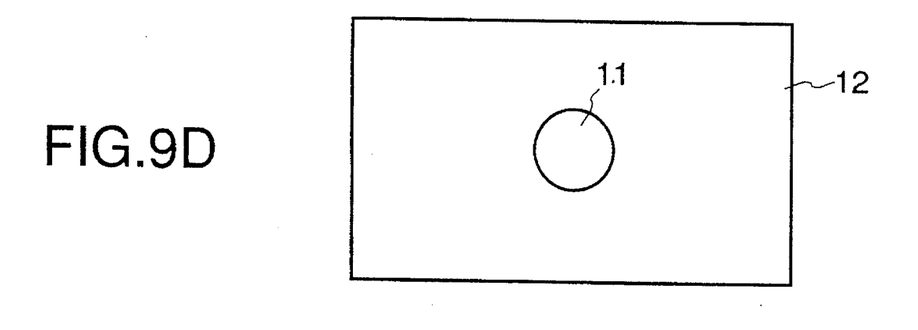

That is, for example, ten sheets of the blank sheets 8 with no slit formed in are laid one on another into a laminated body (FIG. 9A). A plurality of rods (rod-shaped members) 11 of Teflon are placed on the laminated body (FIG. 9B). Then, for example, ten sheets of the blank sheets 8 are laminated thereon (FIG. 9C). The thus-prepared laminated body is hot pressed by a press at 80° C. and 30 MPa to make the green sheets integral with each other (FIG. 9D). Thus one laminated body 12 with a plurality of the rods 11 containing is prepared.

Thus according to the fourth embodiment, the laminated body containing the rods can be formed of the blank sheets alone without the use of slit sheets.

The present invention is not limited to the above-described embodiment and can cover various modifications.

In the above-described embodiments the method for forming the circuit substrate is explained by means of circuit substrate forming steps of the green sheet laminating method using the Teflon rods 11. Numbers of the laminated green sheets, and a number of the slits are not limited to those used in the above-described embodiments.

Sectional shapes of the rod-shaped members placed in the slits, and the channels are not limited to the shape (circular) and the sizes of the embodiments, and may be the so-called substantially circle, such as an ellipse.

In the above-described embodiments, the channels formed in the circuit substrates are for coolants to flow through for cooling the circuit substrate, and as another example, a coolant of a constant temperature may be caused to flow for maintaining the circuit substrate at a constant temperature.

In the fourth embodiment, the channels are juxtaposed with each other in the circuit substrate, but a channel pattern is not limited to that pattern.

In the second and the third embodiments, the two and the three kinds of slit sheets are used to form the grooves inside the circuit substrate. Kinds of the slits sheets may be more.

What is claimed is:

1. A method for forming a ceramic circuit substrate comprising the steps of:

preparing a plurality of blank ceramic green sheets;

forming at least two laminated ceramic green bodies by laminating the plurality of blank ceramic green sheets;

placing a plurality of rod-shaped members in parallel with each other on the first laminated ceramic green body;

sandwiching the rod-shaped members by laminating the second laminated ceramic green body;

pressing the thus laminated ceramic green bodies and the rod-shaped members sandwiched by the first and second laminated ceramic green bodies, and conducting a plastic deformation to the laminated ceramic green bodies to make integral, thereby forming a composite structure composed of a compressed ceramic green body obtained by the compression and deformation of the laminated ceramic green bodies and the rod-shaped members arranged in parallel with each other embedded therein;

pulling out the rod-shaped members from the composite structure, thereby forming a compressed ceramic green body having a plurality of cylindrical spaces, arranged in parallel with each other formed by the removal of the rod-shaped members;

prefiring the compressed ceramic green body to debind an organic binder component in the compressed ceramic green body, thereby forming a presintered ceramic body; and sintering the presintered ceramic body for producing a sintered body having a plurality of coolant channels formed therein for flowing a coolant, wherein each of the plurality of rod-shaped members has low wetting property with respect to the organic binder component in the compressed ceramic green body.

2. A method for forming a ceramic circuit substrate according to claim 1, wherein the blank ceramic green sheets are formed of a composition containing aluminum nitride.

3. A method for forming a ceramic circuit substrate according to claim 1, wherein the rod-shaped members are made of polytetrafluoroethylene.

4. A method for forming a ceramic circuit substrate comprising the steps of:

preparing a plurality of blank ceramic green sheets;

preparing a plurality of slit ceramic green sheets with a plurality of slits arranged in parallel with each other formed therein, obtained by slit-punching of the blank ceramic green sheet;

forming at least two blank laminated ceramic green bodies by laminating the plurality of blank ceramic green sheets;

forming a laminated slit ceramic green body by laminating the plurality of slit ceramic green sheets, thereby forming spaces defined by the slits of the slit ceramic green sheets in the laminated slit ceramic body;

sandwiching the laminated slit ceramic green body with rod-shaped members each placed in each of the spaces by the two blank laminated ceramic green bodies, thereby forming a laminated composite green body with each of the rod-shaped members disposed in each of the spaces;

pressing and conducting a plastic deformation to the laminated composite green body to make integral, thereby forming a composite structure composed of a compressed ceramic green body, obtained by a deformation and compression of the slit and blank ceramic green sheets, and the rod-shaped members arranged in parallel with each other embedded therein;

pulling out the rod-shaped members from the composite structure, thereby forming a compressed ceramic green body having a plurality of cylindrical spaces arranged in parallel with each other formed by the removal of the rod-shaped members;

prefiring the compressed ceramic green body to debind an organic binder component in the compressed ceramic green body, thereby forming a presintered ceramic body; and sintering the presintered ceramic body for producing a sintered body having a plurality of coolant channels formed therein for flowing a coolant, wherein each of the plurality of rod-shaped members has low wetting property with respect to the organic binder component in the compressed ceramic green body.

5. A method for forming a ceramic circuit substrate according to claim 4, wherein first slit ceramic green sheets having first slits formed wider, and second slit ceramic green sheets having second slits formed narrower than the first slits are prepared as the slit ceramic green sheets; and the first slit ceramic green sheets are sandwiched by the second slit ceramic green sheets so that a configuration of each of the spaces defined by the slits of the first and second slit ceramic green sheets fits approximately to a sectional shape of the rod-shaped members.

6. A method for forming a ceramic circuit substrate according to claim 5, wherein the blank ceramic green sheets and the slit ceramic green sheets are formed of a composition containing aluminium nitride.

7. A method for forming a ceramic circuit substrate according to claim 5, wherein the rod-shaped members are made of polytetrafluoroethylene.

8. A method for forming a ceramic circuit substrate according to claim 4, wherein different kinds of slit ceramic green sheets having different in width of slits are prepared as the slit ceramic green sheets; and the slit ceramic green sheets with wider slits are laminated at the middle so that a configuration of each of the spaces defined by the slits of the different kinds of slit ceramic green sheets fits approximately to a sectional shape of the rod-shaped members.

9. A method for forming a ceramic circuit substrate according to claim 8, wherein the blank ceramic green sheets and the slit ceramic green sheets are formed of a composition containing aluminium nitride.

10. A method for forming a ceramic circuit substrate according to claim 8, wherein the rod-shaped members are made of polytetrafluoroethylene.

11. A method for forming a ceramic circuit substrate according to claim 4, wherein the blank ceramic green sheets and the slit ceramic green sheets are formed of a composition containing aluminium nitride.

12. A method for forming a ceramic circuit substrate according to claim 4, wherein the rod-shaped members are made of polytetrafluoroethylene.

13. A method for forming a ceramic circuit substrate according to any one of claims 1 to 10, further comprising the step of forming at least a circuit pattern on a surface of the sintered body.

14. A method for forming a substrate comprising the steps of:

preparing a plurality of blank green sheets;

forming at least two laminated green bodies by laminating the plurality of blank green sheets;

placing a plurality of rod-shaped members in parallel with each other on the first laminated green body;

sandwiching the rod-shaped members by laminating the second laminated green body;

pressing the thus laminated green bodies and the rod-shaped members sandwiched by the first and second laminated green bodies, and conducting a plastic deformation to the laminated green bodies to make integral, thereby forming a composite structure composed of a compressed green body obtained by the compression and deformation of the laminated green bodies and the rod-shaped members arranged in parallel with each other embedded therein;

pulling out the rod-shaped members from the composite structure, thereby forming a compressed green body having a plurality of cylindrical spaces, arranged in parallel with each other formed by the removal of the rod-shaped members;

prefiring the compressed green body to debind an organic binder component in the compressed green body, thereby forming a presintered body; and sintering the presintered body for producing a sintered body having a plurality of coolant channels formed therein for flowing a coolant, wherein each of the plurality of rod-shaped members has low wetting property with respect to the organic binder component in the compressed green body.

15. A method for forming a substrate comprising the steps of:

preparing a plurality of blank green sheets;

preparing a plurality of slit green sheets with a plurality of slits arranged in parallel with each other formed therein, obtained by slit-punching of the blank green sheet;

forming at least two blank laminated green bodies by laminating the plurality of blank green sheets;

forming a laminated slit green body by laminating the plurality of slit green sheets, thereby forming spaces defined by the slits of the slit green sheets in the laminated slit body;

sandwiching the laminated slit green body with rod-shaped members each placed in each of the spaces, by the two blank laminated green bodies, thereby forming a laminated composite green body with each of the rod-shaped members disposed in each of the spaces;

pressing and conducting a plastic deformation to the laminated composite green body to make integral, thereby forming a composite structure composed of a compressed green body, obtained by a deformation and compression of the slit and blank green sheets, and the rod-shaped members arranged in parallel with each other embedded therein;

pulling out the rod-shaped members from the composite structure, thereby forming a compressed green body having a plurality of cylindrical spaces arranged in parallel with each other formed by the removal of the rod-shaped members;

prefiring the compressed green body to debind an organic binder component in the compressed green body, thereby forming a presintered body; and sintering the presintered body for producing a sintered body having a plurality of coolant channels formed therein for flowing a coolant, wherein each of the plurality of rod-shaped members has low wetting property with respect to the organic binder component in the compressed green body.

* * * * *